United States Patent [19]

Theus et al.

[11] Patent Number: 5,604,433
[45] Date of Patent: Feb. 18, 1997

[54] OFFSET COMPENSATION FOR MAGNETIC-FIELD SENSOR WITH HALL EFFECT DEVICE

[75] Inventors: Ulrich Theus, Gundelfingen; Mario Motz, Endingen, both of Germany

[73] Assignee: Deutsche ITT Industries GmbH, Freiburg, Germany

[21] Appl. No.: 523,781

[22] Filed: Sep. 5, 1995

[30] Foreign Application Priority Data

Apr. 19, 1995 [DE] Germany .......................... 44 31 703.4

[51] Int. Cl.$^6$ .......................... G01R 33/06; G01R 33/07; G01D 5/14
[52] U.S. Cl. .................. 324/251; 338/32 H; 324/225; 327/511
[58] Field of Search ........................ 324/251, 207.2, 324/207.12, 225; 338/32 H; 327/511

[56] References Cited

FOREIGN PATENT DOCUMENTS

0548391A1 12/1991 European Pat. Off. .
4302342A1 7/1993 Germany .

Primary Examiner—Walter E. Snow
Attorney, Agent, or Firm—Plevy & Associates

[57] ABSTRACT

The invention relates to a magnetic-field sensor with a Hall effect device, a power supply, and an evaluating facility, which can be supplied with a Hall signal from the Hall-effect device and comprises an input amplifier, a storage element, and a signal superposition unit. To improve the accuracy of the magnetic-field sensor, in a first phase, a balancing signal for balancing the measurement-signal path with respect to an interface can be produced with the evaluating facility, the balancing signal being storable in the storage element, and in a second phase, the balancing signal stored in the storage element can be applied through the signal superposition unit to the interface, where it is superimposed on a Hall signal.

20 Claims, 2 Drawing Sheets

OFFSET COMPENSATION FOR MAGNETIC-FIELD SENSOR WITH HALL EFFECT DEVICE

FIELD OF THE INVENTION

The present invention relates generally to magnetic-field sensors and more specifically to a magnetic-field sensor comprising a Hall-effect device, a power supply, and an evaluating facility which can be supplied with a Hall signal from the Hall-effect device.

BACKGROUND OF THE INVENTION

Magnetic-field sensors which incorporate Hall-effect devices are well known in the art. One example of a magnetic-field sensor is disclosed in European Patent application 0 548 391 A1 entitled OFFSET-COMPENSATED HALL SENSOR, by S. Mehrgardt et al. published on Jun. 30, 1993, and assigned to Deutsche ITT Industries the assignee herein. The magnetic-field sensor disclosed in 0 548 391 A1 comprises a Hall-effect device, a power supply, and an evaluating facility which can be supplied with a Hall signal from the Hall-effect device. The evaluating facility disclosed therein includes an input amplifier, a storage element, and a signal superposition unit. A magnetic-field sensor such as the one disclosed in 1445 is frequently implemented as a monolithic integrated circuit comprising the Hall-effect device, the voltage supply, and the evaluating facility. Such a combined circuit is generally fabricated using conventional silicon integrated circuit processing techniques, such as a bipolar or a MOS.

The accuracy of such a magnetic-field sensor can be increased by compensating for the offset signal component of the Hall-effect device by superposition of a first and a second measurement signal. The offset signal component of the Hall-effect device is caused by mechanical stresses in the environment of the Hall-effect device, i.e., in the crystal structure of the monolithic component. Compensation is achieved during the determination of a first measurement signal, wherein terminal pairs of the Hall-effect device, which are connected to the power supply and the evaluating facility, are reversed with respect to the determination of a second measurement signal. Through the reversal of the terminal pairs, a changeover of the power-supply and the evaluation terminals of the Hall-effect device, henceforth called "terminal-pair changeover", is achieved. The geometry of the Hall-effect device and the terminal pairs causes the resulting useful signal components of the measurement signals before and after the terminal-pair changeover to be in phase, whereas the resulting offset signal components of the Hall-effect device are opposite in phase to one another. By adding the measurement signals produced before and after the changeover, which is done in the evaluating facility, the offset signal component of the Hall-effect device is eliminated. To simulate this effect, a Hall plate is thought of, to a first approximation, as a resistance bridge which is balanced in the presence of a magnetic field. The offset signal component results from resistance changes caused in the crystal of the monolithic component by piezoelectric effects and from lithography inaccuracies, etc.

Although the offset signal component of the Hall-effect device is compensated for in such magnetic-field sensors, the accuracy of these sensors is still reduced by the offset signal components of the electronic components in the evaluating facility. For example, when the evaluating facility adds the first and second signals to compensate for the offset signal component of the Hall-effect device, the offset signal component of the input amplifier of the evaluating facility is added.

It is, therefore, a primary object of the present invention to provide an improved magnetic-field sensor which displays substantially greater accuracy when compared with prior art magnetic-field sensors.

SUMMARY OF THE INVENTION

The object the present invention is accomplished by providing a magnetic-field sensor comprising a Hall-effect device, a power supply, and an evaluating facility including an input amplifier, a storage element, and a signal superposition unit. The magnetic-field sensor of the present invention operates in a first phase, wherein a balancing signal for balancing a measurement-signal path with respect to an interface, is producible with the evaluating facility, the balancing signal being storable in the storage element. The magnetic-field sensor further operates in a second phase, wherein the balancing signal stored in the storage element is feedable via the signal superposition unit to the interface, where it is superimposable on a Hall signal (second Hall signal).

In the arrangement according to the present invention, the offset signal components of the evaluating facility, particularly those of the input amplifier and the superimposition unit, are additionally eliminated. In the first phase, the evaluating facility is offset-nulled, so to speak. This improves the measurement accuracy of the magnetic-field sensor.

BRIEF DESCRIPTION OF THE DRAWINGS

The invention will now be explained in more detail with reference to the accompanying drawings, in which.

DETAILED DESCRIPTION OF THE INVENTION

As described above, the magnetic-field sensor of the present invention generally comprises a Hall-effect device, a power supply, and an evaluating facility including an input amplifier, a storage element, and a signal superposition unit. The magnetic-field sensor of the present invention exhibits a substantial increase in measurement accuracy over prior art sensors in the following manner. A first Hall signal is feedable to an interface in a first phase, and a second Hall signal is producible by inverting the first Hall signal. Through this measure, the useful signal component of the measurement signal doubles, while the offset signal component of the evaluating facility is compensated for. Advantageously, the inversion of the Hall signal can be effected by a terminal-pair changeover of the Hall-effect device. In that case, the Hall-effect device is symmetrical with respect to two orthogonal axes as regards its resistance, and has two correspondingly symmetrical terminal pairs which are alternately connectable via a switching device, to the power supply and the evaluating facility during the first phase and a second phase, with the polarity of the Hall-voltage taps being reversed if necessary. Thus the offset component of the Hall-effect device itself can be eliminated simultaneously with the offset components of the evaluating facility, particularly with those of the input amplifier and the superimposition unit.

Figure 1:
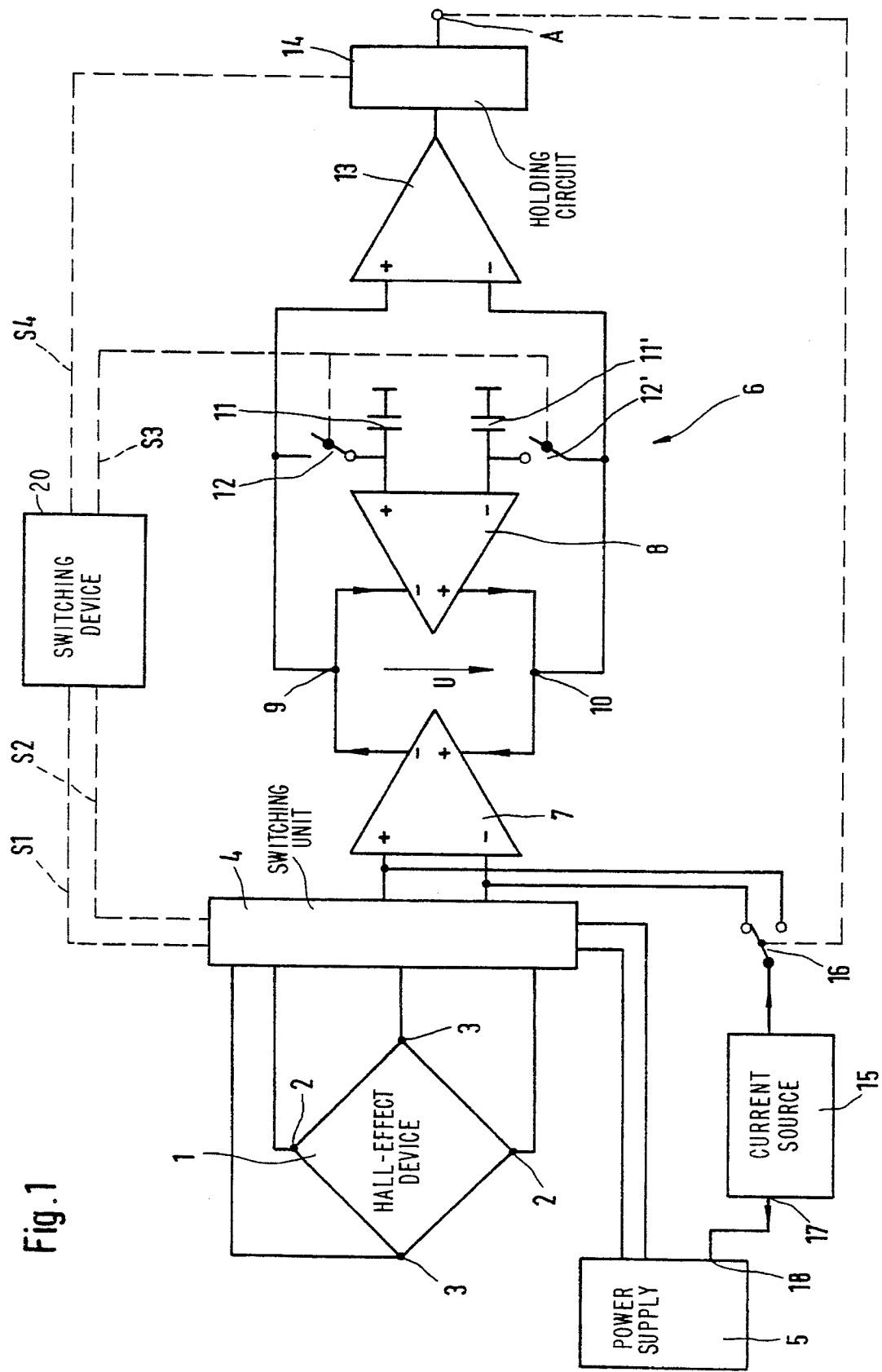
FIG. 1 is a schematic representation of an embodiment of the invention.

Referring now to FIG. 1 a block diagram of an exemplary embodiment of the magnetic-field sensor according to the present invention is shown. The magnetic-field sensor comprises a Hall-effect device 1 with two pairs of terminals 2, 3. The terminal pairs 2, 3 can be connected alternately to a power supply 5 and an evaluating facility 6. In this embodiment, the power supply 5 is a voltage source. The input amplifier and the superposition unit of the evaluating facility 6 include a first transconductance amplifier 7 and a second transconductance amplifier 8. The transconductance amplifiers 7 and 8 are so arranged that their output currents flow to common nodes 9 and 10 for forming the difference between them. The transconductance amplifiers have differential inputs and outputs. This configuration is chosen here to obtain a symmetrical arrangement of the evaluating facility 6, which is operated in a push-pull mode, i.e., differential mode. This symmetry serves to eliminate any interference that may be caused, for example, by external signals. This arrangement converts the measurements signals obtained from the Hall-effect device 1 in the first and second phases, which contain the Hall voltage and the offset voltage of the Hall-effect device, into a first current signal and a second current signal by means of the transconductance amplifier. In response to the first current signal, a voltage is stored in the storage element and converted by the second transconductance amplifier 8 back into a current signal. Since the second transconductance amplifier 8 supplies a current directed opposite to the current of the first transconductance amplifier 7, in the second phase, the first current signal and the second current signal are superimposed in the common nodes such that the useful signal components of the Hall-effect device add, while the offset components of the Hall-effect device and particularly of the first transconductance amplifier 7 neutralize. A current signal is thus obtained which corresponds to twice the value of the useful signal component of the Hall-effect device and is free from offset signal components.

The second transconductance amplifier 8 advantageously has a lower transconductance than the first transconductance amplifier 7. To supply the same output current, a greater voltage is then necessary at the input of the second transconductance amplifier 8, this voltage being stored in the capacitors 11, 11'. As a result, a current signal provided by the second transconductance amplifier 8 has a correspondingly reduced interference susceptibility. Thus, any distortion of the useful signal component for determining the magnetic field due to interference signals at the second transconductance amplifier 8 or the superposition unit is reduced, whereby the accuracy of the magnetic-field sensor is further increased. For example, the transconductance of the second transconductance amplifier 8 can be lower than that of the first transconductance amplifier 7 by a factor of 50, so that the interference-signal components at the second transconductance amplifier 8 will enter into the overall signal with a magnitude reduced by a factor of 50, and thus will no longer reduce the accuracy of the magnetic-field sensor.

To reduce the effect of such interference signals, it is essential that the first measurement signal is stored by the storage unit in amplified form and is output by the superposition unit (second transconductance amplifier 8) in a correspondingly reduced form. Thus, any reduction of the accuracy of the magnetic-field sensor due to the storage unit and the superposition unit is also prevented in other embodiments of the magnetic-field sensor according to the invention in which no transconductance amplifiers are used in the input amplifier and the superposition unit. Thus, as shown in FIG. 1, connected to each input of the second transconductance amplifier 8 is at least one capacitor 11, 11' which comprise the storage unit. Each capacitor enables the first signal to be stored in a simple manner. Between each output of the first transconductance amplifier 7 and the respective input of the second transconductance amplifier 8 located on the same symmetry side of the evaluating facility 6, a respective switching element 12, 12' is provided. The switching elements 12, 12' can be switched by a switching device 20. As will be described, the switching elements are closed by the switching device 20 during a third phase and open during the second phase, the third phase being ended within the first phase. The switching elements 12, 12' can be switched by a switching device, 20 so that the switching elements 12, 12' cause the first measurement signal to be stored in the capacitors 11, 11' in the first phase and the first and second measurement signals to be superimposed in the second phase. To avoid disturbing transient effects, the switching element 20 opens and closes during the first phase.

The output of the evaluating facility 6 shown in FIG. 1, is formed by a comparator 13 in which the voltage U measured between the nodes 9 and 10 is evaluated. The comparator enables the output signal to be compared with a reference signal in a simple manner. This makes it possible to positively determine, for example, whether the magnetic switch points, thus set, were exceeded. The reference value can be a unipolar signal; advantageously, it can also be a difference signal which is fed to the comparator 180° out of phase through a symmetrical arrangement in the evaluating facility. Symmetrical arrangements operated in this manner are used particularly where major external interference has to be avoided during evaluation. The evaluating facility can also be designed to output the measurement result as an analog measurement signal or a digital data word.

Referring still to FIG. 1, the output of the comparator 13 is connected to a holding circuit 14 for storing and passing on an output signal during the second phase. In the embodiment of FIG. 1, the holding circuit 14 is implemented with a latch. The signal from the evaluating facility is not transferred to the latch until the steady state is reached in the second phase. This prevents short-time and nonrelevent changes of state from affecting the output signal, i.e., from being falsely evaluated as signal changes.

As further shown in FIG. 1, a current source 15 for generating a bias signal is applied between the respective terminal pair 2 or 3 which is connected to the evaluating facility 6. The magnetic-field then must exceed a given threshold value to be detected by the magnetic-field sensor. A switching means 16 is connected to the holding circuit 14. Via the switching means 16, a bias signal coming from the current source 15 is applied between the terminal pair 2 or 3 in response to a signal from the holding circuit 14 when the latter has passed on the output signal. Thus, the bias voltage is applied across the respective terminal pair when an output signal from the evaluating facility 6 has been registered. Therefore, the magnetic field must first change by a given value before the magnetic-field sensor will respond to this change. A hysteresis curve is thus obtained which prevents the magnetic-field sensor from constantly changing state, and a stable signal state is produced.

A correction-signal output 17 of the current source 15 for outputting a signal dependent on the temperature of the Hall-effect device is coupled to a control input 18 of the voltage source 5 as shown in FIG. 1. In this arrangement, switching means 16 is switched by means of the signal delivered by the holding circuit 14 when the latter has passed on the output signal. As a result, the threshold magnetic field at the terminal pair assumes another value as soon as an output signal from the holding circuit 14 has been reliably detected. This prevents the evaluating circuit from switching to and fro due to small magnetic-field variations.

To prevent errors due to the temperature and process-technology dependence of the Hall-effect device 1, which would distort the Hall voltage and thus falsify the measured magnetic-field value, the correction signal output 17 of the current source 15 is coupled to the control input 18 of the power supply 5. The current supply 15 may contain a reference resistor made of the same material, and having the same temperature dependence and sheet resistivity, as the Hall-effect device 1. A change in the value of the reference resistor causes a change of the signal at the correction output.

The magnetic-field sensor shown in the embodiment of FIG. 1 includes one Hall-effect device 1. However, in another exemplary embodiment of the invention, a second, laterally displaced Hall-effect device may be connected in parallel with, but in a direction opposite to, the first Hall-effect device with respect to the Hall voltage. The second Hall-effect device must then be geometrically identical to, or have the same resistance as, the first hall-effect device. Thus, the output signal of the two Hall-effect devices will respond only to a magnetic-field difference. Thus, the measurement result is not affected by magnetic interference fields existing at both Hall-effect devices. Accordingly, the magnetic-field sensor can also be used in an environment where external, dynamic or steady, relatively large magnetic fields are unavoidable. For example, the two Hall-effect devices will respond to a distant field, such as magnetic interference field caused by the starter or generator in an automobile, in the same manner, so that any response to such field can be avoided. Near fields, which are caused, for example, by moving a magnet past the Hall-effect devices, are then detected without superposition of distant-field components because of the differential arrangement of the two Hall-effect devices. This relates to both DC magnetic fields and alternating magnetic fields.

What is claimed is:

1. A magnetic-field sensor comprising:

Hall-effect means for generating a first measurement signal during a first phase and a second measurement signal during a second phase, said first and second measurement signals each including a useful signal component and an offset signal component; and measurement signal evaluating means having offset signal components, coupled to said Hall-effect means, said measurement evaluating means operating to substantially eliminate all of said offset signal components by superimposing said first measurement signal received from said Hall-effect means in said first phase on said second measurement signal received from said Hall-effect means in said second phase, said measurement signal evaluation means includes storage means for storing said first measurement signal during said first phase.

2. The magnetic-field sensor according to claim 1, wherein said measurement signal evaluation means includes an interface means, said first measurement signal being transmitted to said interface means during said first phase and said second measurement signal being generated by inverting said first measurement signal.

3. The magnetic-field sensor according to claim 2, further comprising terminal-pair changeover means for producing said inversion of said first measurement signal.

4. The magnetic-field sensor according to claim 1, wherein said storage means comprises at least one capacitor.

5. The magnetic-field sensor according to claim 1, wherein said measurement signal evaluation means includes signal output means.

6. The magnetic-field sensor according to claim 5, wherein said signal output means comprises a comparator.

7. A magnetic-field sensor comprising:

Hall-effect means for generating a first measurement signal during a first phase and a second measurement signal during a second phase, said first and second measurement signals each including a useful signal component and an offset signal component; and measurement signal evaluating means having offset signal components, coupled to said Hall-effect means, said measurement evaluating means operating to substantially eliminate all of said offset signal components by superimposing said first measurement signal received from said Hall-effect means in said first phase on said second measurement signal received from said Hall-effect means in said second phase, said measurement signal evaluation means includes an input amplifier means for converting said first measurement signal into a corresponding current signal and superposition means for supplying a current signal opposite to said current signal provided by said input amplifier means.

8. The magnetic-field sensor according to claim 7, wherein said input amplifier means comprises a first transconductance amplifier and said superposition means comprises a second transconductance amplifier, said opposing current signals provided by first and second transconductance amplifiers being transmitted to at least one common node for forming a difference therebetween.

9. The magnetic-field sensor according to claim 8, wherein said measurement signal evaluation means further includes storage means for storing said first measurement signal during said first phase, said storage means being coupled to an input of said second transconductance amplifier.

10. The magnetic-field sensor according to claim 9, wherein said measurement signal evaluation means further includes switching element means coupled between said storage means and said input of said second transconductance amplifier, said switching element being operative to close during a third phase to store said first measurement signal in said storage means and open during said second phase to enable said first measurement signal to be transmitted from said storage means to said at least one common node, said third phase ending within said first phase.

11. The magnetic-field sensor according to claim 8, wherein said second transconductance amplifier has a substantially lower transconductance than said first transconductance amplifier.

12. The magnetic-field sensor according to claim 5, wherein said output means of said measurement signal evaluating means is coupled to holding circuit means for holding and passing on an output signal during said second phase.

13. The magnetic-field sensor according to claim 1, wherein said Hall-effect means comprises a first Hall-effect device.

14. The magnetic-field sensor according to claim 13, further comprising a second Hall-effect device which is substantially identical to said first Hall-effect device.

15. The magnetic-field sensor according to claim 1, wherein said Hall-effect means includes first and second terminal pairs coupling said Hall-effect means to said meameasurement errors due to the temperature dependence of the sensitivity of the Hall-effect device can be avoided. The signal applied from the voltage source 5 to the Hall-effect device must be changed by the current source so as to compensate for the temperature dependence of the Hall sensitivity. The current source 15 advantageously contains a reference resistance equivalent to the Hall-effect device 1. If the magnetic-field sensor is a monolithic component, the reference resistance equivalent to the Hall-effect device 1 will undergo the same changes due to temperature and process variations as the Hall-effect device. Thus, the correction signal of the current source 15 can be changed in accordance with the changes in the reference resistance, and since the correction signal is applied to the control input 18 of the voltage source 5, the signal applied between the respective terminal pair of the Hall-effect device 1 can be changed accordingly. This makes it possible to very reliably correct measurement errors of the magnetic-field sensor which are due to temperature and process variations.

Figure 2:
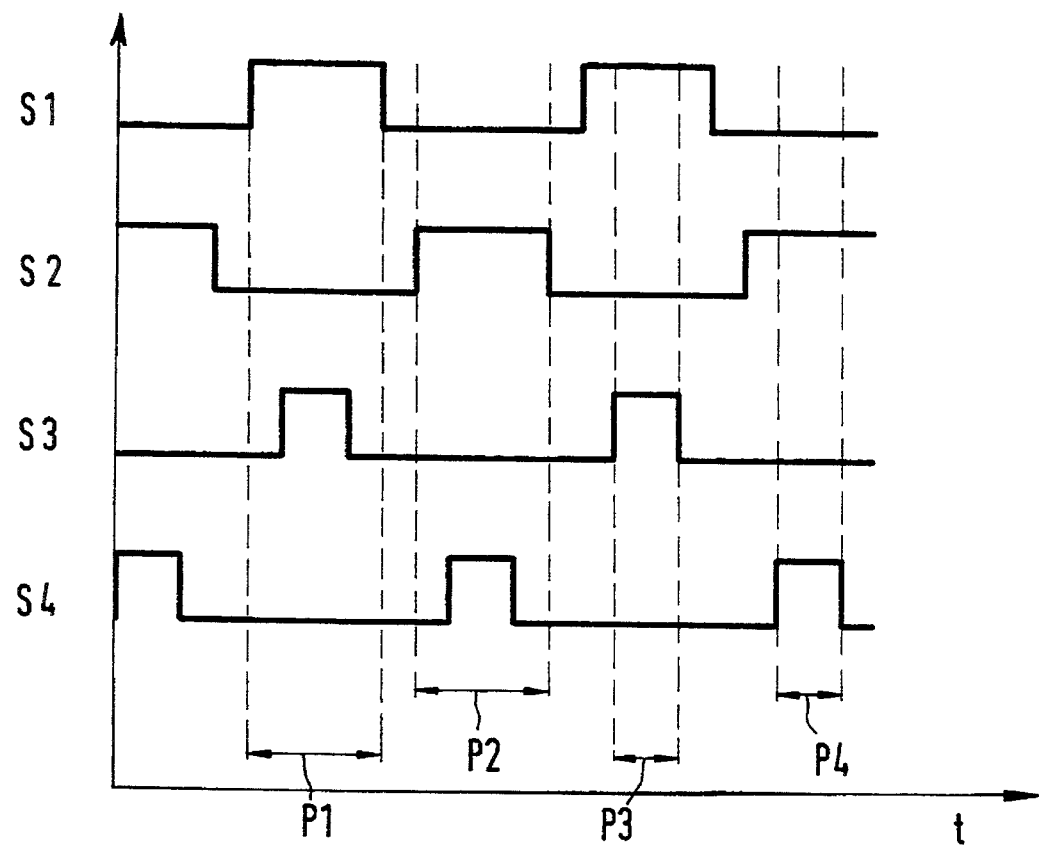
FIG. 2 shows the waveforms of clock signals for the first phase, the second phase, for storing the first signal in the storage element, and for applying a bias signal between a pair of terminals of the Hall-effect device.

The operation of the magnetic-field sensor according to the invention is as follows. Via the switching unit 4, the terminal pairs 2, 3 of the Hall-effect device 1 are connected alternately to the voltage source 5 and the evaluating facility 6 during a first phase P1 and a second phase P2. For example, during the first phase P1, the terminal pair 2 is connected to the voltage source 5, and the terminal pair 3 to the evaluating facility 6. Then, in the second phase P2, the terminal pair 3 of the Hall-effect device is connected via the switching device 4 to the voltage source 5, and the terminal pair 1 to the evaluating facility 6. The clock signal S1 for switching to the first phase P1 is shown in FIG. 2 along with the clock signal S2 for switching to the second phase P2. In the first phase P1, the switching elements 12, 12' are closed. The clock signal S3 closing the switching elements 12, 12' is also shown in FIG. 2. The first measurement signal arriving at the evaluating facility 6 in the first phase P1 contains a first useful signal component and a first offset signal component of the Hall-effect device 1. This measurement signal is converted to a corresponding current signal in the first transconductance amplifier 7. The two different inputs of the first transconductance amplifier 7 produce mutually inverse signals of the same magnitude. These first measurement signals charge the capacitors 11, 11' through the closed switches 12, 12' during a phase P3. The clock signal necessary for this is S3 as shown in FIG. 2. It is chosen so that the charging time of the capacitors 11, 11' lies within the second phase P2, so that a stable state of the second phase is ensured. The second transconductance amplifier 8 supplies a current directed opposite to the current of the first transconductance amplifier 7. These two oppositely directed currents are superimposed at the nodes 9 and 10 to give a zero total current, since they are equal in magnitude. With respect to the resulting differential current at the nodes, the balancing can also be referred to as "zero adjustment", since the automatic adjustment evaluates the magnitude and direction of the differential current as the controlled variable and varies the capacitor voltage 11, 11' until the differential current becomes zero.

In the second phase P2, a second measurement signal is applied to the evaluating facility 6 via the switching device 4. Since in this phase P2 the terminal pairs 2, 3 of the Hall-effect device 1 are reversed from the first phase P1, the second measurement signal contains a second, equally large useful voltage component, which is opposite in phase to the first useful voltage component, and a second offset signal component of the Hall-effect device, is in phase with and equal in magnitude to the first offset signal component of the Hall-effect device. When the second measurement signal passes through the first transconductance amplifier 7, a second offset signal component of the transconductance amplifier 7 and the superposition unit 8 is superimposed on it, this second offset signal component being in phase with the first offset signal component of the first transconductance amplifier 7 and the superposition unit 8, which was superimposed on the first measurement signal. Since the switching elements 12, 12' are open during the second phase P2 (FIG. 2), the voltages of the first measurement signal stored in the capacitors 11, 11' are still applied at the second transconductance amplifier 8. Thus, the currents flowing from the second transconductance amplifier 8 to the nodes 9, 10 are determined by the first measurement signal, whereas the currents supplied by the first transconductance amplifier 7 are determined by the second measurement signal. Since in the first and second phases P1, P2 the differential voltage U between the nodes 9, 10 contains the useful signal components as an in-phase component, and the offset signal components of the Hall-effect device as well as the offset signal components of the input amplifier and the superposition unit as antiphase components, the offset signal components average out of the overall signal U, whereas the useful signal components of the phases P1 and P2 acid together. The voltage detected in the comparator 13 thus corresponds to twice the useful signal component. A prerequisite for this measurement procedure is that the second measurement signal is measured in the presence of an unchanged magnetic field, so that the useful signal components are equal in magnitude.

The symmetrical design of the evaluating facility 6 described here, in which the two symmetrical branches are traversed in push-pull, serves to eliminate frequent interferences. The circuit according to the invention can also be operated with only one branch at a time in which the respective transconductance amplifier 7, 8 has one current output, and in which only one capacitor 11, one switch 12, and a comparator 13 with a reference input are used.

The transconductance amplifiers 7, 8 are chosen so that the second transconductance amplifier 8 has a distinctly lower transconductance than the first transconductance amplifier 7. This can be implemented by suitable choice of the w/1 ratios of the respective transistors. A typical ratio of the transconductances of the transconductance amplifiers 7 and 8 is a factor of 50 as mentioned earlier. In that case, the susceptibility of the measurement-signal compensation to interference is reduced.

When the Hall-effect device 1 senses a magnetic field, the signal presented to the comparator 13 changes. This signal is accepted in the fourth phase P4 as shown in FIG. 2. The signal of the second phase is passed on to the holding circuit 14, which corresponds to a latch. The holding circuit 14 stores the signal and transfers to the output A. The storage and transfer of the signal are controlled by the clock signal S4 shown in FIG. 2. The time for which the signal is stored and must have a given value lies in the middle range of phase 2. This ensures that a steady state is already reached in the second phase, the evaluation phase, so that an actual signal is present rather than just short-time variations.

The current source 15 serves to produce a hysteresis as described earlier. It provides a bias signal which is applied between the terminal pair 1, 2 connected at the respective instant to the evaluating facility 6. This bias signal causes a magnetic field sensed by the Hall-effect device 1 to be registered only if this magnetic field exceeds a predetermined threshold value. The current source 15 is connected to the terminal pair 2 or 3 via the switching means 16. The surement signal evaluation means and further comprising current source means for generating a bias signal to be applied between a respective one of said first and second terminal pairs.

16. The magnetic-field sensor according to claim 15, further comprising switching means coupled to holding circuit means, said holding circuit means being operative to store and pass an output signal from said measurement signal evaluation means in said second phase, said switching means being operative to apply said bias signal from said current source means in response to a signal from said holding circuit means when said holding circuit passes said output signal.

17. The magnetic-field sensor according to claim 15, further comprising power supply means including a control input, said current source means including a correction-signal output which is coupled to said control input, wherein said correction-signal output operates to deliver a signal dependent on the temperature of said Hall-effect means.

18. The magnetic-field sensor according to claim 17, wherein said current source means further includes a reference resistance equivalent to said Hall-effect means.

19. A method for substantially eliminating an offset signal component of a magnetic-field sensor having hall-effect means for generating a first measurement signal during a first phase and a second measurement signal during a second phase, said first and second measurement signals each including a useful signal component and an offset signal component, and measurement signal evaluation means including offset signal components, said method comprising the steps of:

transmitting said first measurement signal from said Hall-effect means to said measurement signal evaluation means during said first phase;

storing said first measurement signal received from said Hall-effect means in said measurement signal evaluation means; and transmitting said second measurement signal from said Hall-effect means to said measurement signal evaluation means during said second phase;

superimposing said first measurement signal on said second measurement signal, wherein said useful signal components are superimposed in phase, and said offset-signal components of said Hall-effect means are superimposed in phase opposition with said offset-set signals of said measurement signal evaluation means.

20. The method according to claim 19, further comprising the steps of:

amplifying said first measurement signal by a given factor before said step of storing; and reducing said first measurement signal by said given factor before said step of superimposing.

* * * * *